United States Patent
He et al.

(10) Patent No.: US 11,694,605 B2
(45) Date of Patent: Jul. 4, 2023

(54) ARCHITECTURE FOR LIGHT EMITTING ELEMENTS IN A LIGHT FIELD DISPLAY

(71) Applicant: GOOGLE LLC, Mountain View, CA (US)

(72) Inventors: Gang He, Cupertino, CA (US); Richard Peter Schneider, Jr., Sunnyvale, CA (US); Andrew Victor Jones, San Jose, CA (US); James Richard Dodd, Jr., Palo Alto, CA (US); Joseph Hsiao-Tien Han, Redwood City, CA (US)

(73) Assignee: GOOGLE LLC, Mountain View, CA (US)

( * ) Notice: Subject to any disclaimer, the term of this patent is extended or adjusted under 35 U.S.C. 154(b) by 0 days.

(21) Appl. No.: 17/408,744

(22) Filed: Aug. 23, 2021

(65) Prior Publication Data
US 2021/0383746 A1 Dec. 9, 2021

Related U.S. Application Data

(63) Continuation of application No. 16/391,850, filed on Apr. 23, 2019, now Pat. No. 11,100,844.
(Continued)

(51) Int. Cl.
*H04N 13/04* (2006.01)
*G09G 3/32* (2016.01)
(Continued)

(52) U.S. Cl.
CPC ........... *G09G 3/32* (2013.01); *G02B 27/0955* (2013.01); *G09G 3/2003* (2013.01); *H04N 23/55* (2023.01); *G09G 2310/0264* (2013.01)

(58) Field of Classification Search
None
See application file for complete search history.

(56) References Cited

U.S. PATENT DOCUMENTS

| 7,402,831 B2 | 7/2008 | Miller et al. |
| 9,395,548 B2 | 7/2016 | Kroon et al. |

(Continued)

FOREIGN PATENT DOCUMENTS

| CN | 205539739 U | 8/2016 |
| CN | 105929552 A | 9/2016 |

(Continued)

OTHER PUBLICATIONS

European Patent Application No. 19791532.5 extended Search Report and Opinion, dated Jan. 5, 2022, 10 pages.
(Continued)

*Primary Examiner* — Carl Adams
(74) *Attorney, Agent, or Firm* — Brake Hughes Bellermann LLP

(57) ABSTRACT

A display system includes (i) a plurality of picture elements supported on a single semiconductor substrate and (ii) a backplane including electronic circuitry supported thereon and electronically connected with the picture elements. Each picture element includes a light steering optical element and an array of light emitting elements. The array of light emitting elements includes a first set, a second set, and a third set of inorganic LEDs that (i) are monolithically integrated on the single semiconductor substrate and (ii) emit, respectively, light at a first, a second, and a third wavelength, which are mutually distinct. The light steering optical element is configured for steering the light from the first set, second set, and third set of LEDs in a predetermined
(Continued)

direction. The electronic circuitry is configured for individually driving each light emitting element of the array of light emitting elements.

10 Claims, 15 Drawing Sheets

Related U.S. Application Data

(60) Provisional application No. 62/662,474, filed on Apr. 25, 2018.

(51) Int. Cl.
*G09G 3/20* (2006.01)
*G02B 27/09* (2006.01)
*H04N 23/55* (2023.01)

(56) References Cited

U.S. PATENT DOCUMENTS

| | | |
|---|---|---|
| 10,431,717 B1 | 10/2019 | Dasgupta et al. |
| 10,515,580 B2 | 12/2019 | Henry et al. |
| 10,957,818 B2 | 3/2021 | Ahmed |
| 2007/0297750 A1 | 12/2007 | Bass et al. |
| 2008/0266468 A1 | 10/2008 | Cossairt et al. |
| 2009/0078955 A1 | 3/2009 | Fan et al. |
| 2010/0118045 A1 | 5/2010 | Elliott et al. |
| 2011/0299044 A1 | 12/2011 | Yeh et al. |
| 2012/0061641 A1 | 3/2012 | Seong et al. |
| 2012/0199852 A1 | 8/2012 | Lowes et al. |
| 2012/0236403 A1 | 9/2012 | Sykora et al. |
| 2013/0009934 A1 | 1/2013 | Nakamizo et al. |
| 2013/0257827 A1 | 10/2013 | Hsieh et al. |
| 2013/0286053 A1 | 10/2013 | Fleck et al. |
| 2013/0335682 A1 | 12/2013 | Gilbert et al. |
| 2014/0029094 A1 | 1/2014 | Kroon et al. |
| 2014/0111856 A1 | 4/2014 | Brug et al. |
| 2015/0069433 A1 | 3/2015 | Haase |
| 2015/0249820 A1 | 9/2015 | Saigo et al. |
| 2015/0332635 A1 | 11/2015 | Lau et al. |
| 2015/0364523 A1 | 12/2015 | Sato |
| 2016/0234487 A1 | 8/2016 | Kroon et al. |
| 2016/0238352 A1 | 8/2016 | Baldridge et al. |
| 2016/0254638 A1 | 9/2016 | Chen et al. |
| 2016/0322432 A1 | 11/2016 | Yang et al. |
| 2016/0351855 A1 | 12/2016 | Yang et al. |
| 2017/0061838 A1 | 3/2017 | Shi et al. |
| 2017/0129272 A1 | 5/2017 | Rich et al. |
| 2017/0150115 A1 | 5/2017 | Vandewalle et al. |
| 2017/0186368 A1 | 6/2017 | Hirai et al. |
| 2017/0208319 A1 | 7/2017 | Kim et al. |
| 2017/0237973 A1* | 8/2017 | Jung .................. G02B 30/27 348/59 |
| 2017/0272739 A1 | 9/2017 | Kroon et al. |
| 2017/0316736 A1* | 11/2017 | Hughes ............... H01L 25/0753 |
| 2017/0323925 A1 | 11/2017 | Schneider et al. |
| 2017/0358562 A1 | 12/2017 | Banna et al. |
| 2017/0358604 A1 | 12/2017 | Lee et al. |
| 2018/0067329 A1 | 3/2018 | Kim et al. |
| 2018/0097033 A1 | 4/2018 | Ahmed |
| 2018/0102085 A1 | 4/2018 | Pan |
| 2018/0114878 A1 | 4/2018 | Danesh et al. |
| 2018/0130400 A1 | 5/2018 | Meitl et al. |
| 2018/0196272 A1 | 7/2018 | Chen |
| 2019/0164473 A1* | 5/2019 | Hack ................... H10K 50/805 |
| 2019/0214529 A1 | 7/2019 | Ahmed |
| 2019/0334064 A1 | 10/2019 | Pourquier et al. |
| 2020/0052048 A1* | 2/2020 | Kuo ..................... G06F 1/1686 |

FOREIGN PATENT DOCUMENTS

| | | |
|---|---|---|
| JP | H11-74566 A | 3/1999 |
| JP | 3005115 B2 | 1/2000 |
| JP | 2014517336 A | 7/2014 |
| JP | 2016-533030 A | 10/2016 |
| JP | 2017529557 A | 10/2017 |
| KR | 10-2012-0048678 A | 5/2012 |
| KR | 101265727 B1 | 5/2013 |
| KR | 10-2014-0097559 A | 8/2014 |
| WO | WO 2017/079395 A | 5/2017 |
| WO | WO 2017-117825 A1 | 7/2017 |
| WO | WO 2017192667 A1 | 11/2017 |
| WO | WO 2017-219415 A1 | 12/2017 |
| WO | WO 2018-063391 A1 | 4/2018 |

OTHER PUBLICATIONS

U.S. Appl. No. 16/392,061, Final Office Action dated Apr. 5, 2021, 28 pages.
European Patent Application No. 19793170.2 extended European Search Report and Opinion, dated Dec. 9, 2021, 8 pages.
International Application No. PCT/US2019/028927, International Search Report and Written Opinion dated Jul. 30, 2019, 12 pages.
U.S. Appl. No. 16/392,061 Office Action dated Aug. 21, 2020, 46 pages.
International Search Report and Written Opinion corresponding to International Application No. PCT/US2019/028907 dated Aug. 22, 2019.
Korean Patent Application No. 10-2020-7033990 Office Action dated Jun. 27, 2022, 8 pages.
English translation of Korean Patent Application No. 10-2020-7033990 Office Action dated Jun. 27, 2022, 10 pages.
U.S. Appl. No. 16/392,061 Non-Final Office Action dated May 10, 2022, 31 pages.
U.S. Appl. No. 16/392,061 Final Office Action dated Feb. 28, 2022, 30 pages.

* cited by examiner

ARCHITECTURE FOR LIGHT EMITTING ELEMENTS IN A LIGHT FIELD DISPLAY

CROSS REFERENCE TO RELATED APPLICATIONS

The present application is a continuation of U.S. application Ser. No. 16/391,850, filed Apr. 23, 2019, which claims priority to and the benefit of U.S. Provisional Application No. 62/662,474, entitled "ARCHITECTURE FOR LIGHT EMITTING ELEMENTS IN A LIGHT FIELD DISPLAY," and filed on Apr. 25, 2018, the contents of which are incorporated herein by reference in their entirety.

BACKGROUND OF THE DISCLOSURE

Aspects of the present disclosure generally relate to displays, and more specifically, to an architecture for light emitting elements in a light field display.

With the advent of different video applications and services, there is a growing interest in the use of displays that can provide an image in three full dimensions (3D). There are different types of displays capable of doing so, including volumetric displays, holographic displays, integral imaging displays, and compressive light field displays, to name a few. Existing display technologies can have several limitations, including limitations on the views provided to the viewer, the complexity of the equipment needed to provide the various views, or the cost associated with making the display.

Light field or lightfield displays, however, present some of the better options as they can be flat displays configured to provide multiple views at different locations to enable the perception of depth or 3D to a viewer. Light field displays can require a large number of light emitting elements, at resolutions that can be two to three orders of magnitude greater than those of traditional displays. Therefore, there are challenges in both the number of light emitting elements and the manner in which they are organized that need consideration to enable the ultra-high-density required to provide the best possible experience to a viewer.

SUMMARY OF THE DISCLOSURE

In a first aspect, a display system includes (i) a plurality of picture elements supported on a single semiconductor substrate and (ii) a backplane including electronic circuitry supported thereon. The electronic circuitry is electronically connected with the plurality of picture elements. Each one of the plurality of picture elements includes a light steering optical element and an array of light emitting elements. The array of light emitting elements includes a first set, a second set, and a third set of inorganic light emitting diodes (LEDs). Each inorganic LED in the first set, second set, and third set of inorganic LEDs is configured for emitting light at a first wavelength, a second wavelength, and a third wavelength, respectively. The second wavelength differs from the first wavelength. The third wavelength differs from each of the first and second wavelengths. The first, second, and third sets of inorganic LEDs are monolithically integrated on the single semiconductor substrate. The light steering optical element is configured for steering the light from the first, second, and third inorganic LEDs in a predetermined direction. The electronic circuitry is configured for individually driving each light emitting element of the array of light emitting elements.

In a second aspect, a method for forming a display system includes integrally forming a plurality of picture elements on a semiconductor substrate. The method also includes electronically connecting a plurality of electronic circuits, formed on a backplane, with the plurality of picture elements. Integrally forming the plurality of picture elements includes forming, on the semiconductor substrate: a first set of inorganic light emitting diodes (LEDs) configured for emitting light at a first wavelength, a second set of inorganic LEDs configured for emitting light at a second wavelength, and a third set of inorganic LEDs configured for emitting light at a third wavelength. The second wavelength differs from the first wavelength. The third wavelength differs from each of the first and second wavelengths. Electronically connecting the plurality of electronic circuits includes configuring the plurality of electronic circuits to individually drive each one of the LEDs in the first, second, and third sets of inorganic LEDs.

BRIEF DESCRIPTION OF THE DRAWINGS

The appended drawings illustrate only some implementation and are therefore not to be considered limiting of scope.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

Figure 1A:
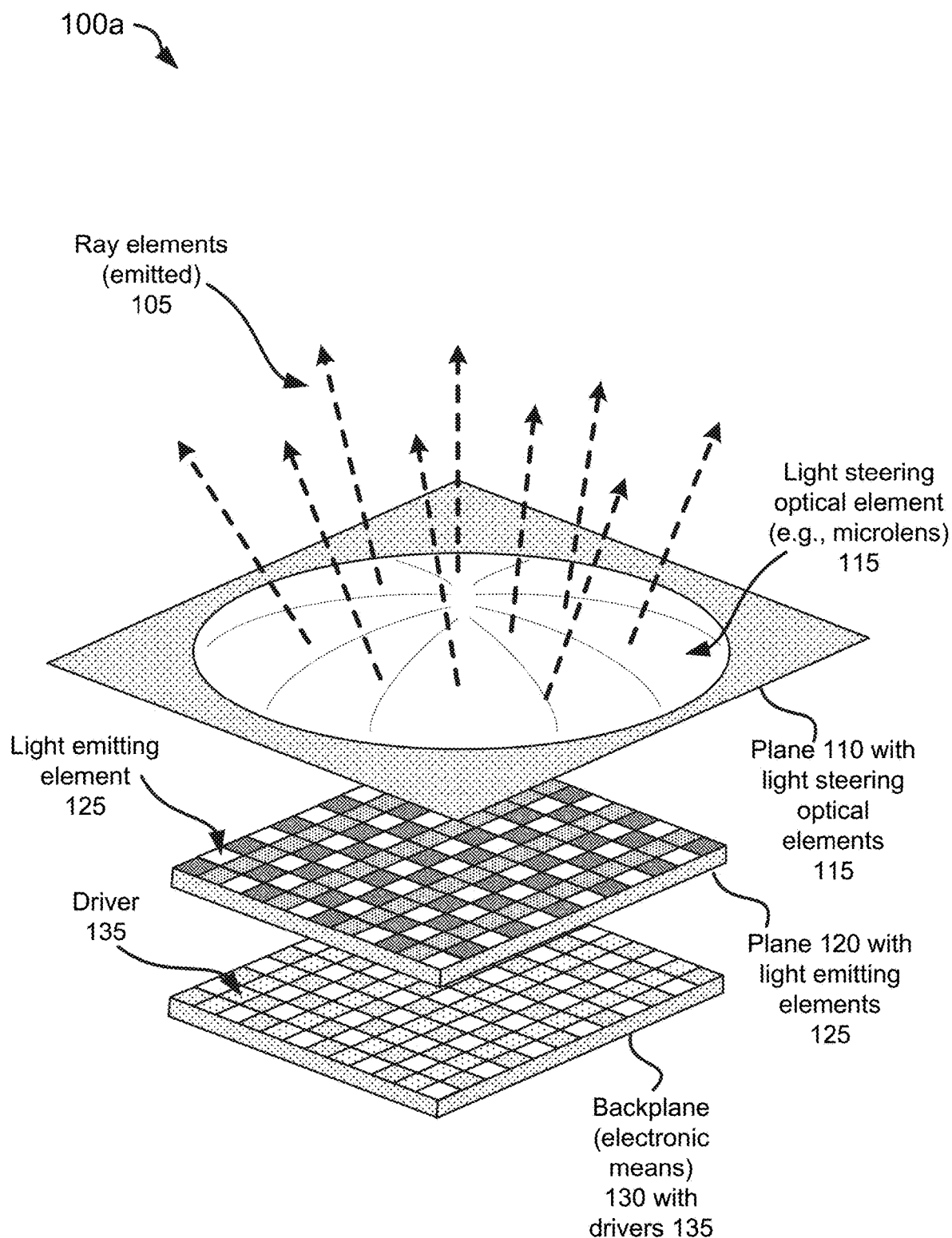
FIG. 1A illustrates an example of a picture element for light field displays, in accordance with aspects of this disclosure.

FIG. 1A shows a diagram 100a describing an example of a picture element for light field displays, also referred to as multi-view displays, for example. A light field display (see e.g., light field displays 310 in FIGS. 3-5) can include multiple picture elements (see e.g., picture elements 320 in FIGS. 3-5), which can be organized in arrays, grids, or other types of ordered arrangements. In some implementations, the multiple picture elements can be monolithically integrated on a same semiconductor substrate. That is, multiple picture elements can be fabricated, constructed, and/or formed from one or more layers of the same or different materials disposed, formed, and/or grown on a single, continuous semiconductor substrate. Additional details regarding materials and other aspects related to the semiconductor substrate are provided below. In this disclosure, the term "picture element" and the term "super-raxel" can be used interchangeably to describe a similar structural unit in a light field display. In some instances, a "picture element" can be referred to as a pixel, but it is different from a pixel used in traditional displays.

A single picture element can include many light emitting elements 125. As noted above, a picture element is different from a pixel in a traditional display in that a pixel generally identifies a discrete element that emits light (e.g., in a non-directional manner, Lambertian emission) while a picture element includes multiple light emitting elements 125, which are themselves organized and configured to produce or generate light outputs that can be directional in nature, where these light outputs (e.g., ray elements) contribute to the formation of multiple, different light field views that are to be provided by the light field display to a viewer in different locations or positions away from the light field display. In an example, each particular location or position away from the light field display can be associated with a light field view provided by the light field display. Additional aspects regarding the arrangement and characteristics of the light emitting elements 125 in a picture element are described in more detail below, further identifying differences between a picture element in a light field display and a pixel in a traditional display.

A picture element can have a corresponding light steering optical element 115 as shown in FIG. 1A. The light steering optical element 115 can be configured to steer or direct different ray elements 105 produced (e.g., emitted) by the light emitting elements 125. In an aspect, the different ray elements 105 may correspond to different directions of light outputs produced by one or more light emitting elements 125. In this regard, the directional resolution of the picture element or the light field display may correspond to a number of light output directions supported. Moreover, the light field views provided by the light field display are produced by a contribution from various light outputs that are received by the viewer in a particular location or position away from the light field display. The light steering optical element 115 can be considered part of the picture element, that is, the light steering optical element 115 is an integral component of the picture element. The light steering optical element 115 can be aligned and physically coupled or bonded to the light emitting elements 125 of its respective picture element. In some implementations, there may be one or more layers or materials (e.g., optically transparent layers or materials) disposed between the light steering optical element 115 and the light emitting elements 125 of its respective picture element.

In one example, a light steering optical element 115 can be a microlens or a lenslet as shown in FIG. 1A, which can be configured to steer or direct the ray elements 105 (e.g., the different light field views) in the appropriate directions. A light steering optical element 115 can include a single optical structure (e.g., a single microlens or lenslet) or can be constructed or formed to include multiple optical structures. For example, a light steering optical element 115 can have at least one microlens, at least one grating, or a combination of both. In another example, a light steering optical element 115 can have multiple layers of optical components (e.g., microlenses and/or gratings) that combined produce the appropriate light steering effect. For example, a light steering optical element 115 can have a first microlens and a second microlens stacked over the first microlens, with the first microlens being associated with a first layer and the second microlens being associated with a second layer. A different example can use a grating or a grating and microlens combination in either or both layers. The construction of the light steering optical element 115, and therefore the positioning and characteristics of any microlenses and/or gratings built or formed therein, is intended to produce the proper steering or directing of the ray elements 105.

Different types of devices can be used for the light emitting elements 125. In one example, a light emitting element 125 can be a light-emitting diode (LED) made from one or more semiconductor materials. The LED can be an inorganic LED. To achieve the high densities needed in light field displays, the LED can be, for example, a micro-LED, also referred to as a microLED, an mLED, or a μLED, which can provide better performance, including brightness and energy efficiency, than other display technologies such as liquid crystal display (LCD) technology or organic LED (OLED) technology. The terms "light emitting element," "light emitter," or "emitter," can be used interchangeably in this disclosure, and can also be used to refer to a microLED. Moreover, any of these terms can be used interchangeably with the term "sub-raxel" to describe a similar structural unit in a light field display.

The light emitting elements 125 of a picture element can be monolithically integrated on a same semiconductor substrate. That is, the light emitting elements 125 can be fabricated, constructed, and/or formed from one or more layers of the same or different materials disposed, formed, and/or grown on a single, continuous semiconductor substrate. The semiconductor substrate can include one or more of GaN, GaAs, $Al_2O_3$, Si, SiC, $Ga_2O_3$, alloys thereof, or derivatives thereof. For their part, the light emitting elements 125 monolithically integrated on the same semiconductor substrate can be made at least partially of one or more of AN, GaN, InN, AlAs, GaAs, InAs, AlP, GaP, InP, alloys thereof, or derivatives thereof. In some implementations, each of the light emitting elements 125 can include a quantum well active region made from one or more of the materials described above.

The light emitting elements 125 can include different types of light emitting elements or devices to provide light of different colors, which in turn enable the light field display to make visually available to viewers a particular color gamut or range. In an example, the light emitting elements 125 can include a first type of light emitting element that produces green (G) light, a second type of light emitting element that produces red (R) light, and a third type of light emitting element that produces blue (B) light. In another example, the light emitting elements 125 can optionally include a fourth type of light emitting element that produces white (W) light. In another example, a single light emitting element 125 may be configured to produce different colors of light. Moreover, the lights produced by the light emitting elements 125 in a display enable the entire range of colors available on the display, that is, the display's color gamut. The display's color gamut is a function of the wavelength and linewidth of each of the constituent color sources (e.g., red, green, blue color sources).

In one implementation, the different types of colors of light can be achieved by changing the composition of one or more materials (e.g., semiconductor materials) in the light emitting elements or by using different structures (e.g., quantum dots of different sizes) as part of or in connection with the light emitting elements. For example, when the light emitting elements 125 of a picture element are LEDs, a first set of the LEDs in the picture can be made at least in part of InGaN with a first composition of indium (In), a second set of the LEDs can be made at least in part of InGaN with a second composition of In different from the first composition of In, and a third set of the LEDs can be made at least in part of InGaN with a third composition of In different from the first and second compositions of In.

In another implementation, the different types of colors of light can be achieved by applying different color converters (e.g., color downconverters) to light emitting elements that produce a same or similar color of light. In one implementation, some or all of the light emitting elements 125 can include a respective color conversion media (e.g., color conversion material or combination of materials). For example, each of the light emitting elements 125 in a picture element is configured to produce blue light. A first set of the light emitting elements 125 simply provides the blue light, a second set of the light emitting elements 125 is further configured to downconvert (e.g., using one conversion media) the blue light to produce and provide green light, and a third set of the light emitting elements 125 is also further configured to downconvert (e.g., using another conversion media) the blue light this time to produce and provide red light.

The light emitting elements 125 of a picture element can themselves be organized in arrays, grids, or other types or ordered arrangements just like picture elements can be organized using different arrangements in a light field display.

Additionally, for each picture element there can be one or more drivers 135 for driving or operating the light emitting elements 125. The drivers 135 can be electronic circuits or means that are part of a backplane 130 and electronically coupled to the light emitting elements 125. The drivers 135 can be configured to provide the appropriate signals, voltages, and/or currents in order to drive or operate the light emitting elements 125 (e.g., to select a light emitting element, control settings, control brightness). In some implementations, there can be a one-to-one correspondence in which one driver 135 can be used to drive or operate a respective light emitting element 125. In other implementations, there can be a one-to-many correspondence in which one driver 135 can be used to drive or operate multiple light emitting elements 125. For example, the drivers 135 can be in the form of unit cells that are configured to drive a single light emitting element 125 or multiple light emitting elements 125.

In addition to the backplane 130 that includes the drivers 135, a light field display can also include a plane 120 having the light emitting elements 125. Moreover, a light field display can also include a plane 110 having the light steering optical elements 115. In an implementation, two of more of the plane 110, the plane 120, and the backplane 130 can be integrated or bonded together to form a stacked or three-dimensional (3D) structure. Additional layers, planes, or structures (not shown) can also be part of the stacked or 3D structure to facilitate or configure the connectivity, interoperability, adhesion, and/or distance between the planes. As used in this disclosure, the term "plane" and the term "layer" can be used interchangeably.

Figure 1B:
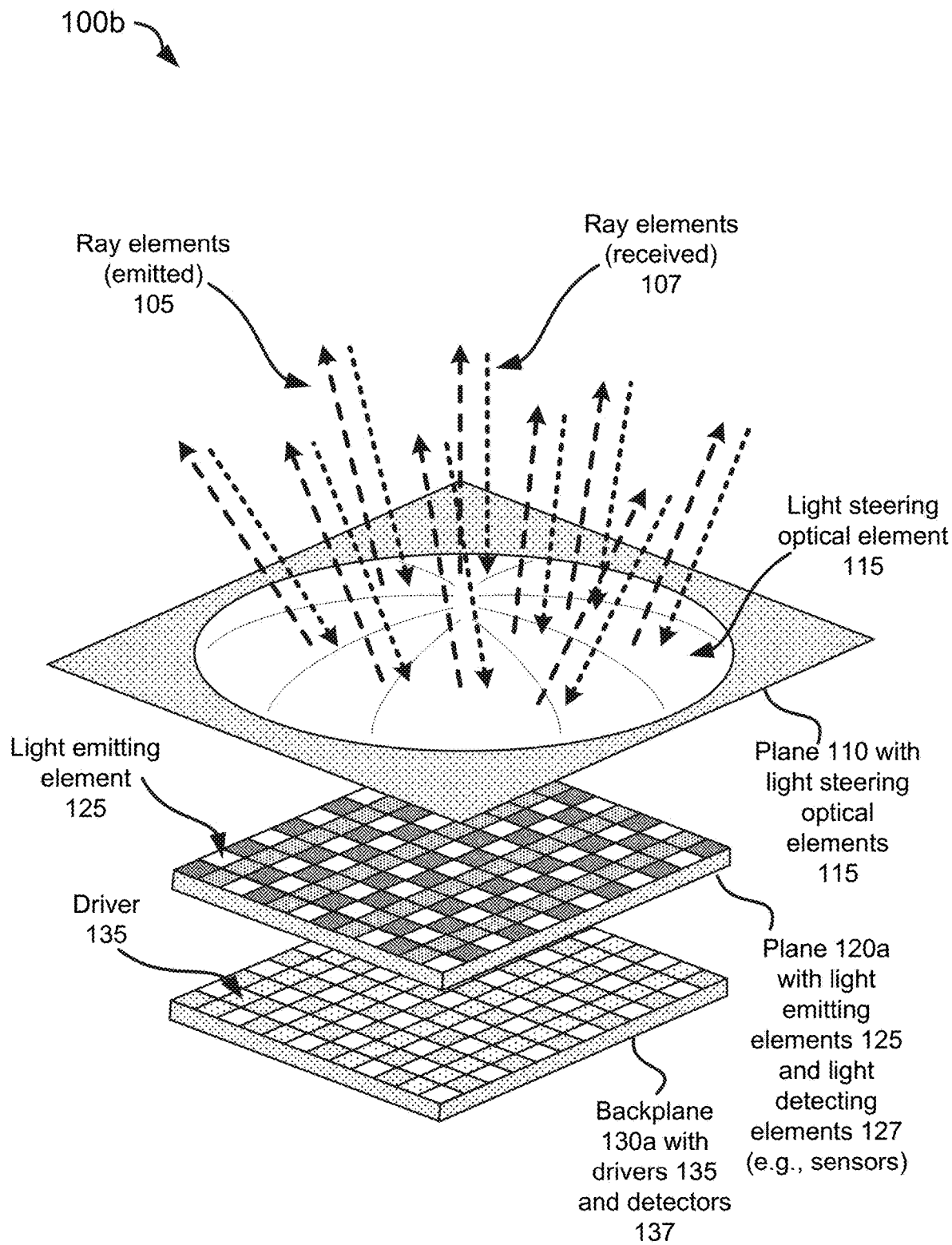
FIG. 1B illustrates another example of a picture element for light field displays, in accordance with aspects of this disclosure.

FIG. 1B shows a diagram 100b illustrating another example of a picture element for light field displays. In this example, the picture element can not only provide or emit ray elements 105 (as shown also in FIG. 1B), but can also be configured to receive ray elements 107 through the light steering optical element 115. The ray elements 107 can correspond to directional light inputs that contribute to various views being received by the picture element or the light field display just like the ray elements 105 can correspond to directional light outputs that contribute to various views being provided by the picture element or the light field display to a viewer.

In the example in FIG. 1B, a plane 120a having the light emitting elements 125 can also include one or more light detecting elements 127 to receive or capture light associated with the ray elements 107. The one or more light detecting elements 127 can be positioned in the plane 120a adjacently surrounded by the light emitting elements 125, or alternatively, the one or more light detecting elements 127 can be positioned in the plane 120a separate from the light emitting elements 125. The terms "light detecting element," "light detector," "light sensor," or "sensor," can be used interchangeably in this disclosure.

In some implementations, the light detecting elements 127 can be monolithically integrated on the same semiconductor substrate as the light emitting elements 125. As such, the light detecting elements 127 can be made of the same types of materials as described above from which the light emitting elements 125 can be made. Alternatively, the light detecting elements 127 can be made of different materials and/or structures (e.g., silicon complimentary metal-oxide-semiconductor (CMOS) or variations thereof) from those used to make the light emitting elements 125.

Moreover, a plane 130a having the drivers 135 can also include one or more detectors 137 electronically coupled to the light detecting elements 127 and configured to provide the appropriate signals, voltages, and/or currents to operate the light detecting elements 127 (e.g., to select a light detecting element, control settings) and to produce signals (e.g., analog or digital signal) representative of the light that is received or captured by the light detecting elements 127.

The construction of the light steering optical element 115 in FIG. 1B, and therefore the positioning and characteristics of any microlenses and/or gratings built therein, is intended to produce the right steering or directing of the ray elements 105 away from the picture element to provide the various contributions that are needed for a viewer to perceive the light field views, and also to produce the right steering or directing of the ray elements 107 towards the appropriate light detecting elements 127. In some implementations, the light detecting elements 127 may use separate or additional light steering optical elements than the light steering optical element 115 used in connection with the light emitting elements 125. In such cases, the light steering optical element for the light detecting elements 127 can be included in the plane 110 having the light steering optical elements 115.

The different picture element structures described in FIGS. 1A and 1B enable control, placement, and directivity of the ray elements produced by the light emitting elements 125 of the picture element. In addition, the picture element structures in FIG. 1B enable control, placement, and directivity of the ray elements received by the picture element.

Figure 2:
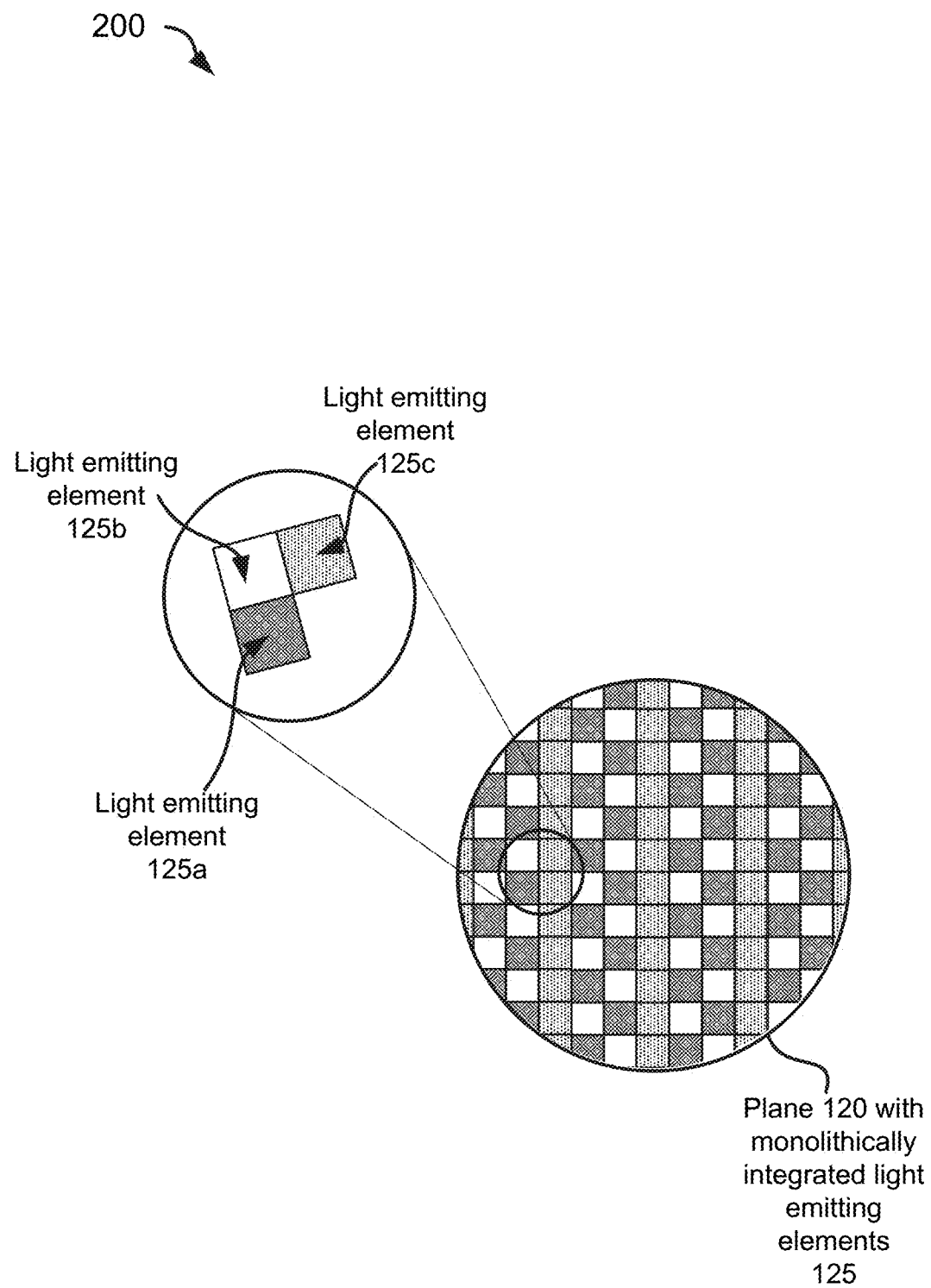
FIG. 2 illustrates an example of light emitting elements in a picture element, in accordance with aspects of this disclosure.

In FIG. 2, a diagram 200 shows an example of a pattern or mosaic of light emitting elements 125 in a picture element. In this example, a portion of an array or grid of light emitting elements 125 that are part of a picture element is enlarged to show one of different patterns or mosaics that can be used for the various types of light emitting elements 125. This example shows three (3) different types of light emitting elements 125, a first type of light emitting element 125a that produces light of one color, a second type of light emitting element 125b that produces light of another color, and a third type of light emitting element 125c that produces light of yet another color. These light colors can be red light, green light, and blue light, for example. In some implementations, the pattern can include twice as many light emitting elements that produce red light than those that produce green light or blue light. In other implementations, the pattern can include a light emitting element that produces red light that is twice a size of those that produce green light or blue light. In other implementations, the pattern can include a fourth type of light emitting element 125 that produces light of fourth color, such as white light, for example. Generally, the area of light emitting elements of one color can be varied relative to the area of light emitting elements of other color(s) to meet particular color gamut and/or power efficiency needs. The patterns and colors described in connection with FIG. 2 are provided by way of illustration and not of limitation. A wide range of patterns and/or colors (e.g., to enable a specified color gamut in the display) may be available for the light emitting elements 125 of a picture element. In another aspect, additional light emitting elements (of any color) can be used in a particular pattern to provide redundancy.

The diagram 200 in FIG. 2 also illustrates having the various types of light emitting elements 125 (e.g., light emitting elements 125a, 125b, and 125c) monolithically integrated on a same semiconductor substrate. For example, when the different types of light emitting elements 125 are based on different materials (or different variations or compositions of the same material), each of these different materials needs to be compatible with the semiconductor substrate such that the different types of light emitting elements 125 can be monolithically integrated with the semiconductor substrate. This allows for the ultra-high-density arrays of light emitting elements 125 (e.g., arrays of RGB light emitting elements) that are needed for light field displays.

Figure 3:
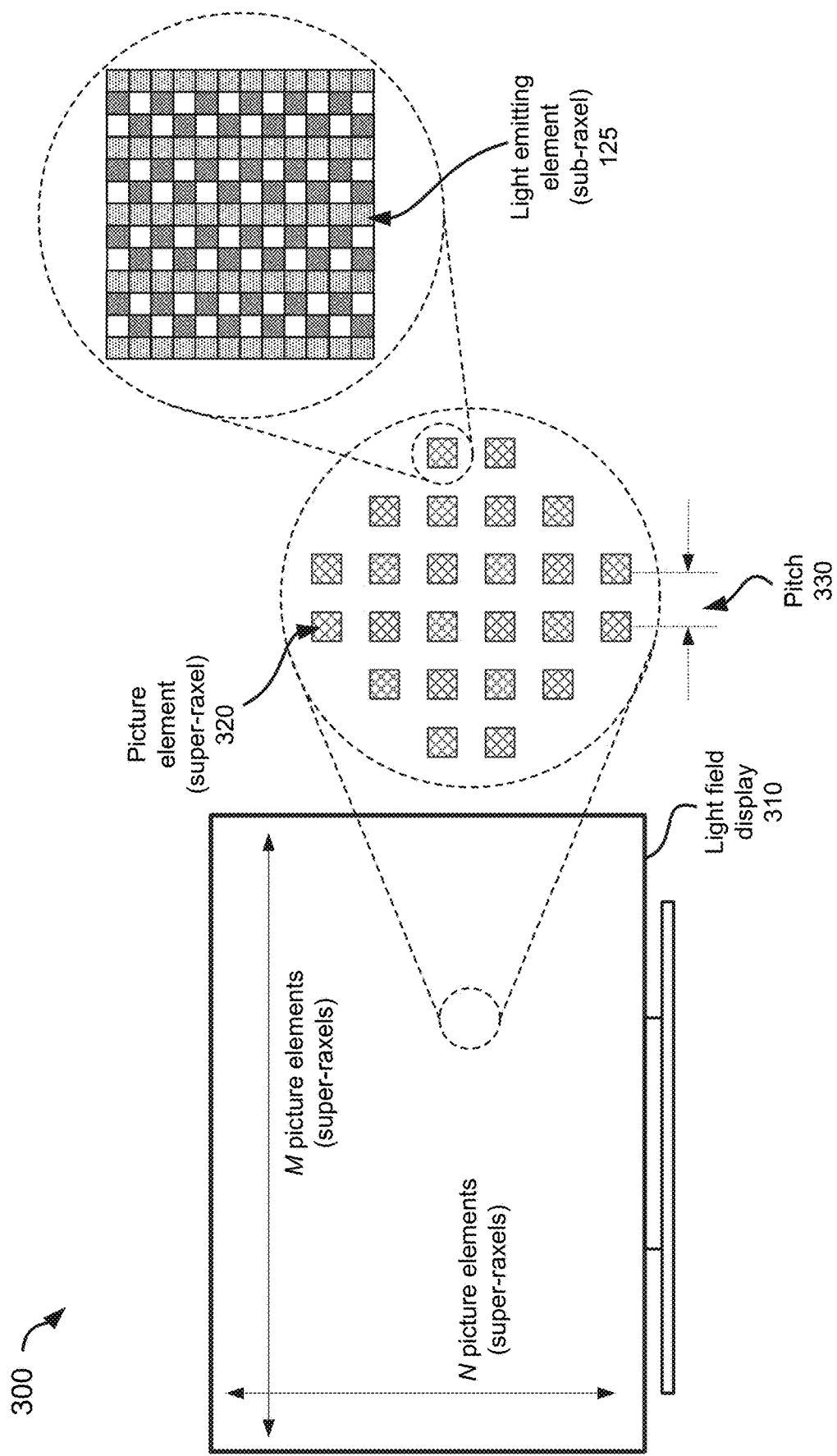
FIG. 3 illustrates an example of a light field display having multiple picture elements, in accordance with aspects of this disclosure.

A diagram 300 in FIG. 3 shows a light field display 310 having multiple picture elements or super-raxels 320. A light field display 310 can be used for different types of applications and its size may vary accordingly. For example, a light field display 310 can have different sizes when used as displays for watches, near-eye applications, phones, tablets, laptops, monitors, televisions, and billboards, to name a few. Accordingly, and depending on the application, the picture elements 320 in the light field display 310 can be organized into arrays, grids, or other types of ordered arrangements of different sizes. In the example shown in FIG. 3, the picture elements 320 can be organized or positioned into an N×M array, with N being the number of rows of picture elements in the array and M being the number of columns of picture elements in the array. An enlarged portion of such an array is shown to the right of the light field display 310. For small displays, examples of array sizes can include N≥10 and M≥10 and N≥100 and M≥100, with each picture element 320 in the array having itself an array or grid of light emitting elements 125. For larger displays, examples of array sizes can include N≥500 and M≥500, N≥1,000 and M≥1,000, N≥5,000 and M≥5,000, and N≥10,000 and M≥10,000, with each picture element 320 in the array having itself an array or grid of light emitting elements 125.

In a more specific example, for a 4K light field display in which the pixels in a traditional display are replaced by the picture elements 320, the N×M array of picture elements 320 can be a 2,160×3,840 array including approximately 8.3 million picture elements 320. Depending on the number of light emitting elements 125 in each of the picture elements 320, the 4K light field display can have a resolution that is one or two orders of magnitude greater than that of a corresponding traditional display. When the picture elements or super-raxels 320 include as light emitting elements 125 different LEDs that produce red (R) light, green (G) light, and blue (B) light, the 4K light field display can be said to be made from monolithically integrated RGB LED super-raxels.

Each of the picture elements 320 in the light field display 310, including its corresponding light steering optical element 115 (e.g., an integral imaging lens), can represent a minimum picture element size limited by display resolution. In this regard, an array or grid of light emitting elements 125 of a picture element 320 can be smaller than the corresponding light steering optical element 115 for that picture element. In practice, however, it is possible for the size of the array or grid of light emitting elements 125 of a picture element 320 to be similar to the size of the corresponding light steering optical element 115 (e.g., the diameter of a microlens or lenslet), which in turn is similar or the same as a pitch 330 between picture elements 320.

An enlarged view of an array of light emitting elements 125 for a picture element 320 is shown to the right of the diagram 300. The array of light emitting elements 125 can be a P×Q array, with P being the number of rows of light emitting elements 125 in the array and Q being the number of columns of light emitting elements 125 in the array. Examples of array sizes can include P≥5 and Q≥5, P≥8 and Q≥8, P≥9 and Q≥9, P≥10 and Q≥10, P≥12 and Q≥12, P≥20 and Q≥20, and P≥25 and Q≥25. In an example, a P×Q array is a 9×9 array including 81 light emitting elements or sub-raxels 125. The array of light emitting elements 125 for the picture element 320 need not be limited to square or rectangular shapes and can be based on a hexagonal shape or other shapes as well.

For each picture element 320, the light emitting elements 125 in the array can include separate and distinct groups of light emitting elements 125 (see e.g., group of light emitting elements 610 in FIGS. 6A, 6B, and 8A) that are allocated or grouped (e.g., logically grouped) based on spatial and angular proximity and that are configured to produce the different light outputs (e.g., directional light outputs) that contribute to produce light field views provided by the light field display 310 to a viewer. The grouping of sub-raxels or light emitting elements into raxels need not be unique. For example, during assembly or manufacturing, there can be a mapping of sub-raxels into particular raxels that best optimize the display experience. A similar re-mapping can be performed by the display once deployed to account for, for example, aging of various parts or elements of the display, including variations in the aging of light emitting elements of different colors and/or in the aging of light steering optical elements. In this disclosure, the term "groups of light emitting elements" and the term "raxel" can be used interchangeably to describe a similar structural unit in a light field display. The light field views produced by the contribution of the various groups of light emitting elements or raxels can be perceived by a viewer as continuous or non-continuous views.

Each of the groups of light emitting elements 125 in the array of light emitting elements 125 includes light emitting elements that produce at least three different colors of light (e.g., red light, green light, blue light, and perhaps also white light). In one example, each of these groups or raxels includes at least one light emitting element 125 that produces red light, one light emitting element 125 that produces green light, and one light emitting element 125 that produce blue light. In another example, each of these groups or raxels includes two light emitting elements 125 that produce red light, one light emitting element 125 that produces green light, and one light emitting element 125 that produces blue light. In yet another example, each of these groups or raxels includes one light emitting element 125 that produces red light, one light emitting element 125 that produces green light, one light emitting element 125 that produces blue light, and one light emitting element 125 that produces white light.

Because of the various applications (e.g., different sized light field displays) descried above, the sizes or dimensions of some of the structural units described in connection with the light field display 310 can vary significantly. For example, a size of an array or grid of light emitting elements 125 (e.g., a diameter, width, or span of the array or grid) in a picture element 320 can range between about 10 microns and about 1,000 microns. That is, a size associated with a picture element or super-raxel 320 can be in this range. The term "about" as used in this disclosure indicates a nominal value or a variation within 1%, 2%, 3%, 4%, 5%, 10%, 15%, 20%, or 25% from the nominal value.

In another example, a size of each group of light emitting elements 125 (e.g., a diameter, width, or span of the group) in a picture element 320 can range between about 1 micron and about 10 microns. That is, a size associated with a group of light emitting elements 125 (e.g., raxel 610) can be in this range.

In another example, a size of a group of light emitting elements 125 in a picture element 320 can be greater than 10 microns because a size of the light emitting elements 125 in such a group could be as large as 10 microns.

In yet another example, a size of each light emitting element 125 (e.g., a diameter, width, or span of the light emitting element or sub-raxel) can range between about 0.4 microns and about 4 microns. Similarly, a size of each light emitting element 125 (e.g., a diameter, width, or span of the light emitting element or sub-raxel) can be less than about 1 micron. Moreover, a size of each light emitting element 125 in some implementations can be as large as 10 microns. That is, a size associated with a light emitting element or sub-raxel 125 can be in the ranges described above.

In yet another example, a size of a light steering optical element 115 (e.g., a diameter, width, or span of a microlens or lenslet) can range between about 10 microns and about 1,000 microns, which is similar to the range of sizes for a picture element or super-raxel.

Figure 4:
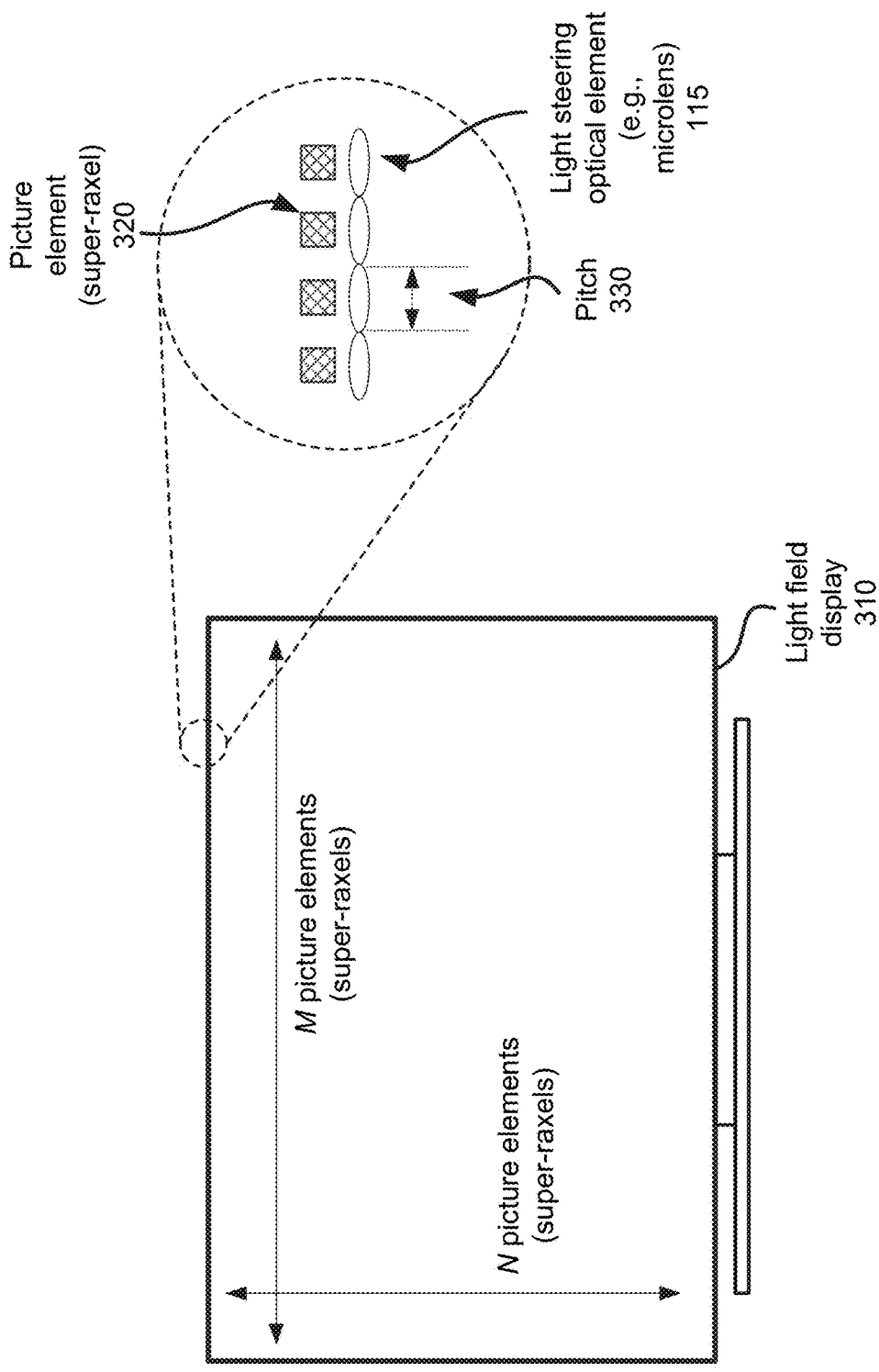
FIG. 4 illustrates another example of a light field display having multiple picture elements, in accordance with aspects of this disclosure.

In FIG. 4, a diagram 400 shows another example of the light field display 310 illustrating an enlarged view of a portion of an array of picture elements 320 with corresponding light steering optical elements 115. The pitch 330 can represent a spacing or distance between picture elements 320 and can be about a size of the light steering optical element 115 (e.g., size of a microlens or lenslet).

In this example, the light field display 310 in FIG. 4 can be a 4K light field display with a 2,160×3,840 array of picture elements or super-raxels 320. In such a case, for a viewer distance of about 1.5 meters or about 5 feet, a size of the light steering optical element 115 can be about 0.5 millimeters. Such a size can be consistent with human acuity of about 1 arc-minute/picture element. The viewer's field of view (FOV) in this example can be about 64 degrees, which can be less than a viewing angle provided by the picture element (e.g., viewing angle>FOV). Moreover, the multiple views provided by the 4K light field display in this example can have a 4 millimeter width, consistent with a diameter of the human pupil. This can translate to the light steering optical element 115 steering the output light produced by a picture element 320 having, for example, $31^2$ light emitting elements 125. Accordingly, the 4K light field display in this example can provide continuous parallax with light field phase or horizontal parallax with light field phase.

Figure 5:
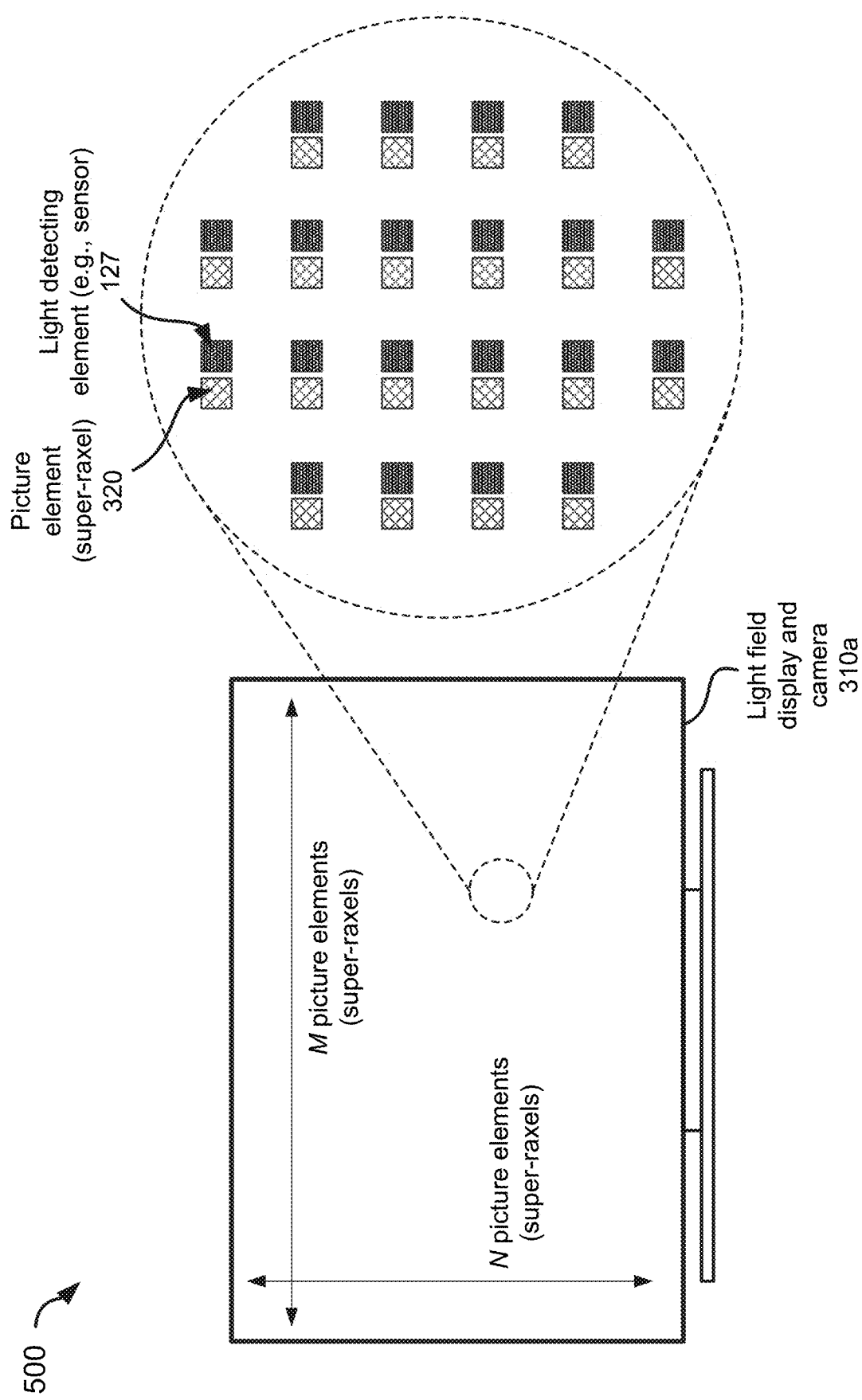
FIG. 5 illustrates an example of a light field display and camera having multiple picture elements and light detecting elements, in accordance with aspects of this disclosure.

A diagram 500 in FIG. 5 illustrates an alternative configuration of a light field display that is also capable of operating as a camera by performing light field capture using neighboring light detecting elements or sensors 127. In this example, a light field display and camera 310a includes an N×M array of picture elements 320, a portion of the array is shown enlarged to the right of the diagram 500. The light detecting elements 127 can be, for example, silicon-based image sensors assembled with similar integral optical elements as those used by the picture elements 320 (e.g., the light steering optical elements 115). In one implementation, as shown in FIG. 5, the light detecting elements 127 can be positioned nearby or adjacent to the picture elements 320 in a one-to-one correspondence (e.g., one capture element for each display element). In other implementations, the number of light detecting elements 127 can be less than the number of picture elements 320.

In an example, each light detecting element 127 can include multiple sub-sensors for capturing light in the same fashion as each picture element 320 (e.g., a super-raxel) can include multiple light emitting elements 125 (e.g., multiple sub-raxels) or multiple groups of light emitting elements 125 (e.g., multiple raxels).

As described above in connection with FIG. 1B, the light detecting elements 127 can be integrated in the same plane 120a as the light emitting elements 125. Some or all of the features of the light detecting elements 127, however, could be implemented in the backplane 130a since the backplane 130a is also likely to be silicon-based (e.g., a silicon-based substrate). In such a case, at least some of the features of the light detecting elements 127 can be integrated with the detectors 137 in the backplane 130a to more efficiently have the circuitry or electronic means in the detectors 137 operate the light detecting elements 127.

Figure 6A:
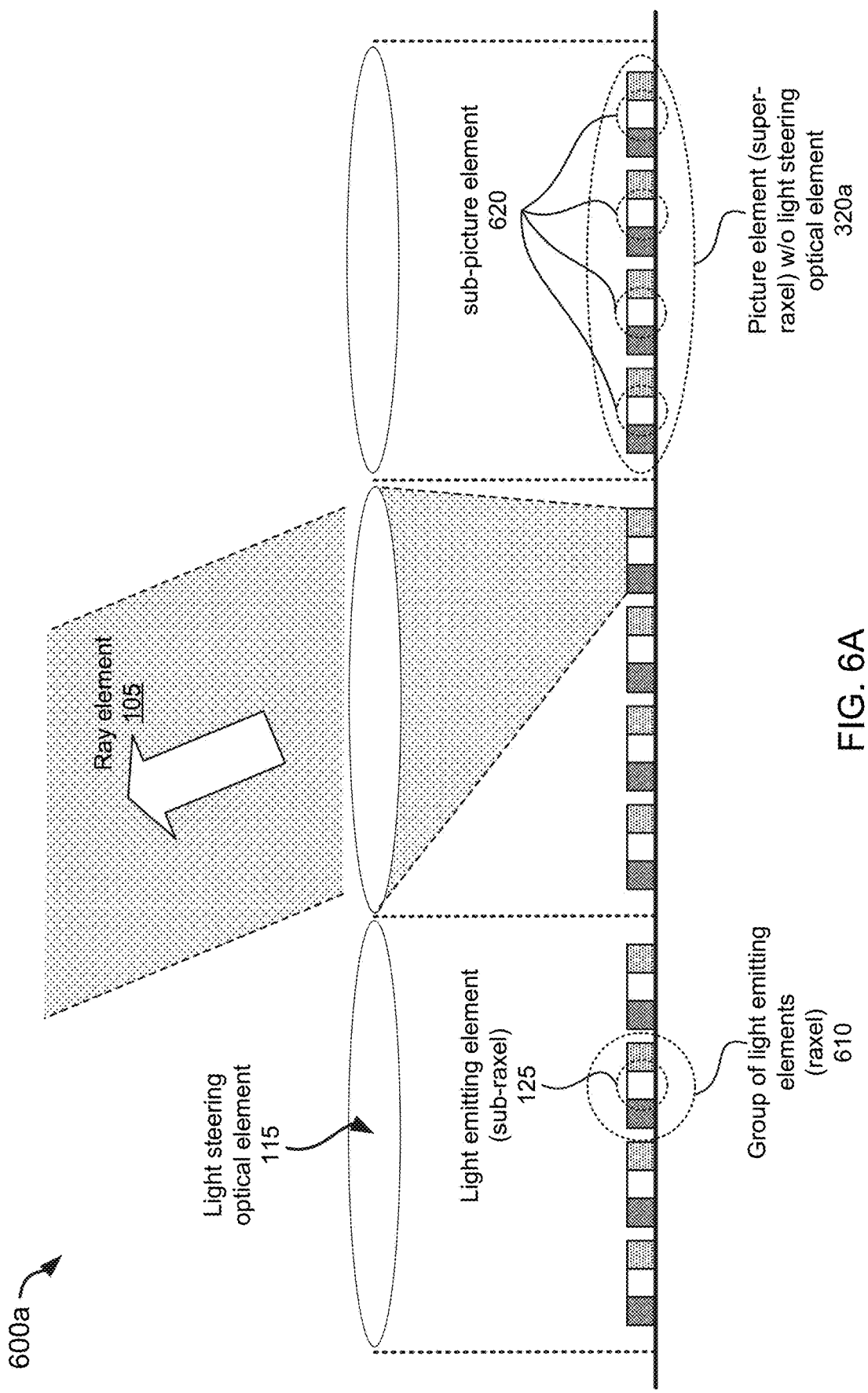
FIG. 6A illustrates an example of a cross-sectional view of a portion of a light field display, in accordance with aspects of this disclosure.

A diagram 600a in FIG. 6A shows a cross-sectional view of a portion of a light field display (e.g., the light field display 310) to illustrate some of the structural units described in this disclosure. For example, the diagram 600a shows three adjacent picture elements or super-raxels 320a, each having a corresponding light steering optical element 115. In this example, the light steering optical element 115 can be considered separate from the picture element 320a but in other instances the light steering optical element 115 can be considered to be part of the picture element.

As shown in FIG. 6A, each picture element 320a includes multiple light emitting elements 125 (e.g., multiple sub-raxels), where several light emitting elements 125 (e.g., several sub-raxels) of different types can be grouped together into the group 610 (e.g., into a raxel) associated with a particular light view to be provided by the light field display. A group or raxel can produce various components (see FIG. 6B) that contribute to a particular ray element 105 as shown by the right-most group or raxel in the middle picture element 320a. Is it to be understood that the ray elements 105 produced by different groups or raxels in different picture elements can contribute to a view perceived by viewer away from the light field display.

An additional structural unit described in FIG. 6A is the concept of a sub-picture element 620, which represents a grouping of the light emitting elements 125 of the same type (e.g., produce the same color of light) of the picture element 320a. Additional details related to sub-picture elements 620 are described below in connection with FIGS. 8B, 9B, and 9C.

Figure 6B:
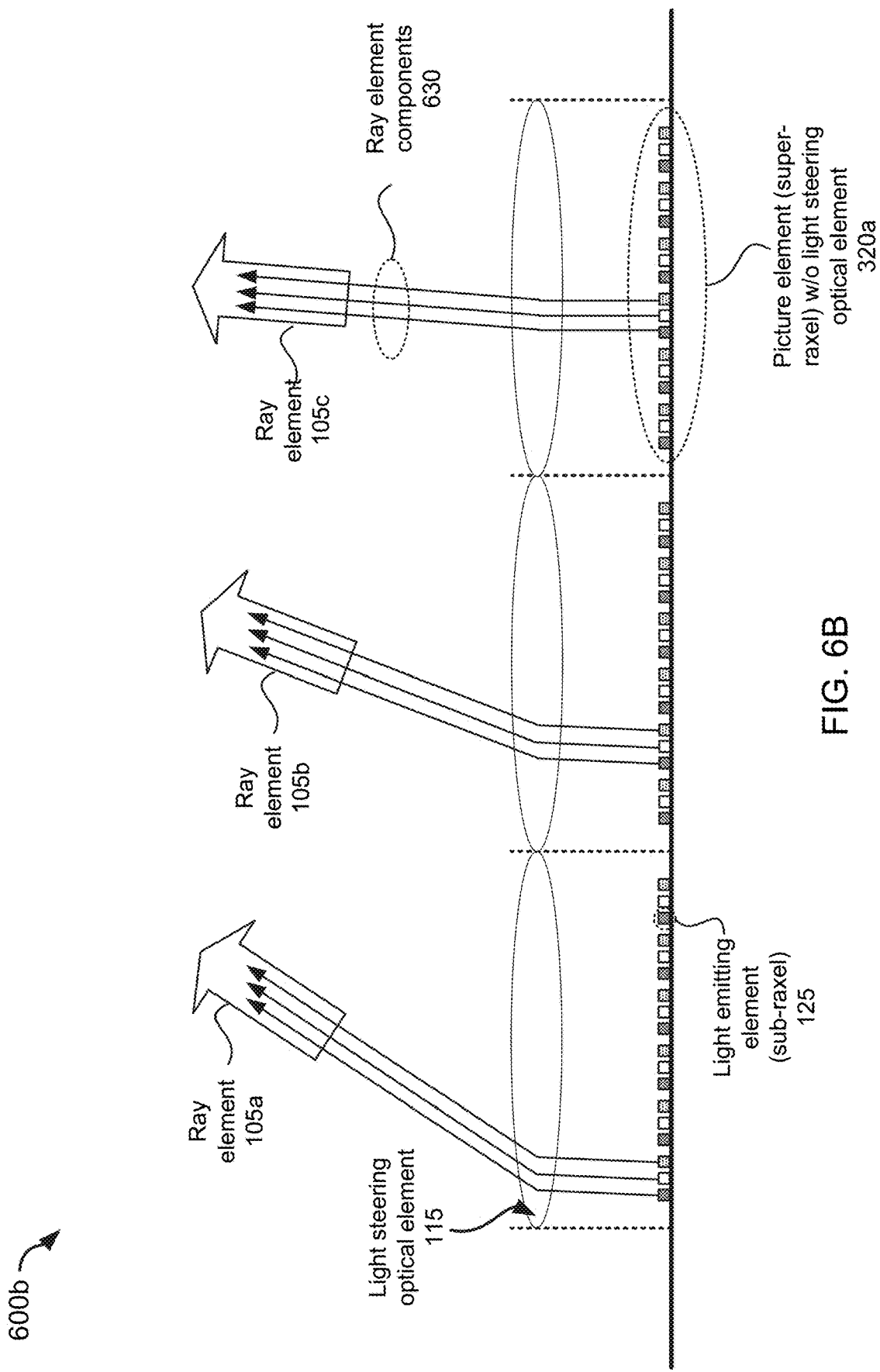
FIG. 6B illustrates another example of a cross-sectional view of a portion of a light field display, in accordance with aspects of this disclosure.

A diagram 600b in FIG. 6B shows another cross-sectional view of a portion of a light field display (e.g., the light field display 310) to illustrate the varying spatial directionality of the ray elements produced by three adjacent picture elements or super-raxels 320a, each having a corresponding light steering optical element 115. In this example, a group of light emitting elements 125 in the left-most picture element 320a produces a ray element 105a (e.g., light output), where the ray element 105a is a combination of ray element components 630 (e.g., light output sub-components) produced or generated by the group of light emitting elements 125. For example, when the group of light emitting elements 125 includes three light emitting elements 125, each of these can produce or generate a component (e.g., a light component of a different color) of the ray element 105a. The ray element 105a has a certain, specified spatial directionality, which can be defined based on multiple angles (e.g., based on two or three angles).

Similarly, a group of light emitting elements 125 in the middle picture element 320a produces a ray element 105b (e.g., light output), where the ray element 105b is a combination of ray element components 630 produced or generated by the group of light emitting elements 125. The ray element 105b has a certain, specified spatial directionality, different from the one of the ray element 105a, which can also be defined based on multiple angles. The same applies for the ray element 105c produced by a group of light emitting elements 125 in the right-most picture element 320a.

Figure 7A:
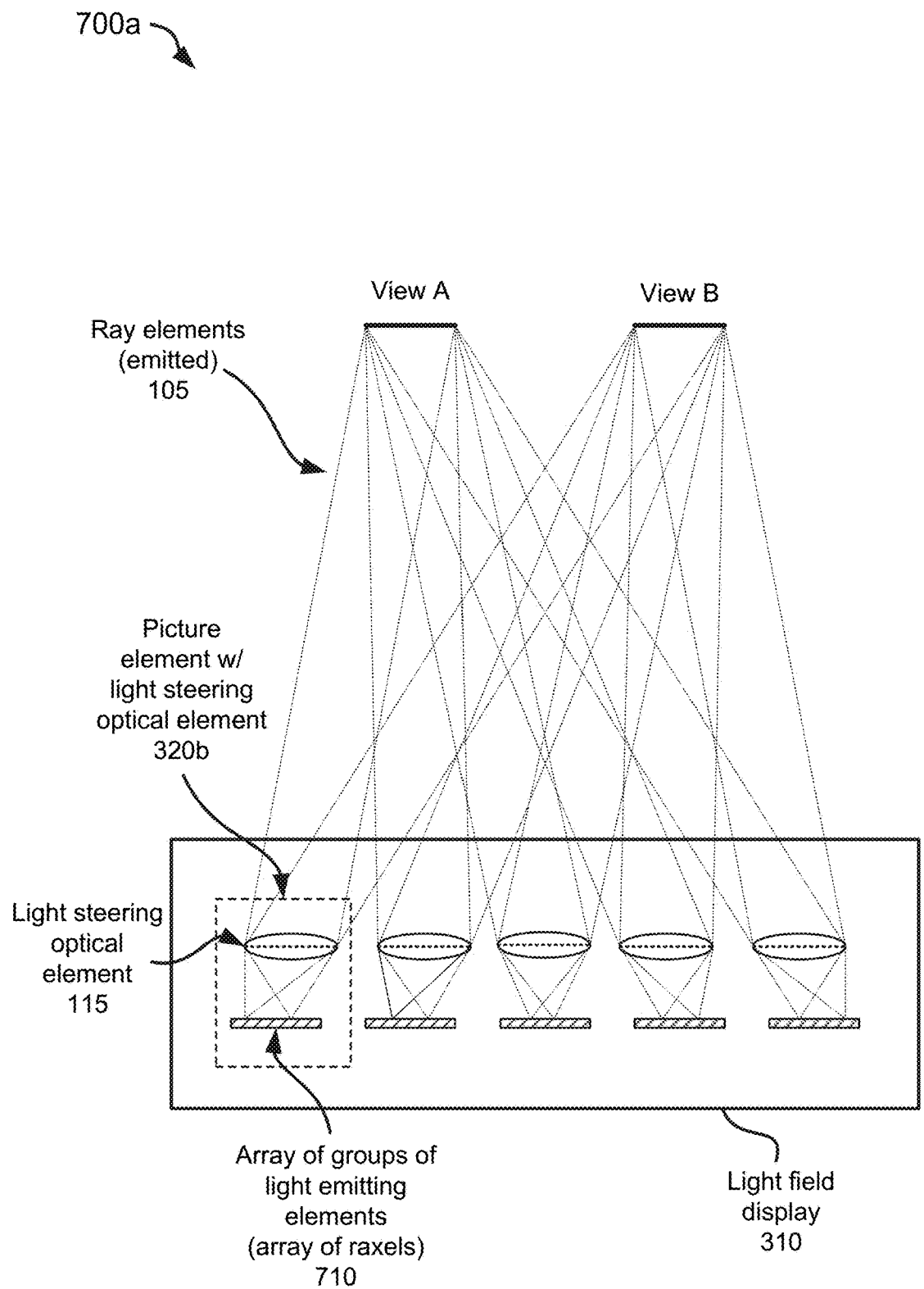
FIG. 7A illustrates an example of a configuration of a light field display, in accordance with aspects of this disclosure.

The following figures describe different configurations for a light field display (e.g., the light field display 310). In FIG. 7A, a diagram 700a shows a first configuration or approach for a light field display. In this configuration, which can be referred to as a picture element array of raxel arrays, different light field views (e.g., View A, View B) can be provided by combining the ray elements 105 emitted by the various picture elements 320b in the light field display 310.

In this example, the light steering optical element 115 can be considered to be part of the picture elements 320b. For each picture element 320b, there is an array or grid 710 of groups of light emitting elements 125 (e.g., an array or grid of raxels), where each of these groups produces a light output having at least one component (see FIG. 6B) that is provided by the light field display 310 as a contribution to construct or form a view perceived by a viewer at a certain location or position from the light field display 310. For example, in each of the picture elements 320b, there is at least one group or raxel in the array 710 that contributes to View A and there is at least another group or raxel in the array 710 that contributes to View B. In some instances, depending on the location or position of the viewer relative to the light field display 310, the same group or raxel can contribute to both View A and View B.

In an aspect of the light field display 310 in FIG. 7A, for each picture element 320b, there can be a spatial (e.g., lateral) offset between a position of the light steering optical element 115 and a position of the array 710 based on where the picture element 320b is positioned in the light field display 310.

Figure 7B:
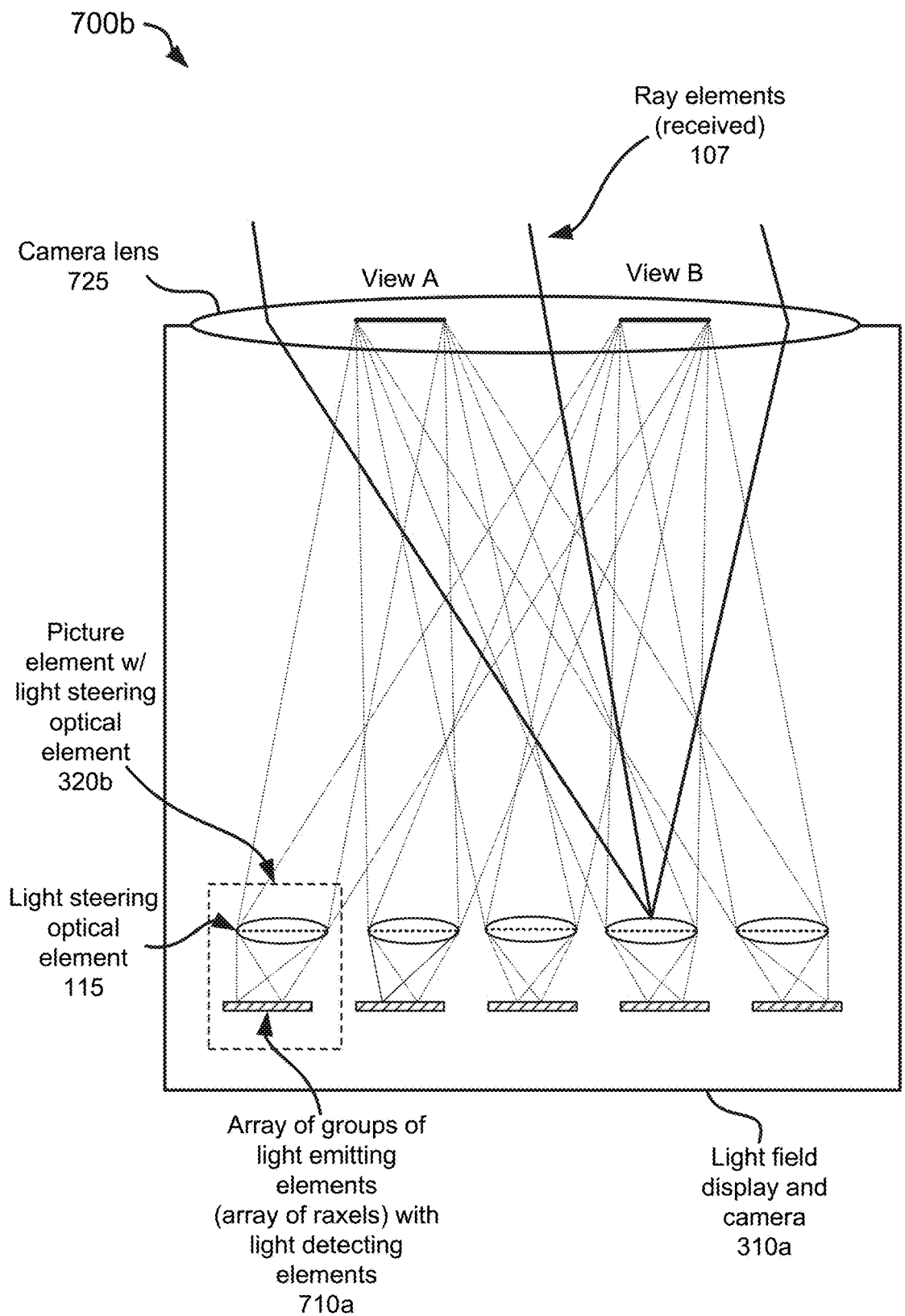
FIG. 7B illustrates another example of a configuration of a light field display, in accordance with aspects of this disclosure.

In FIG. 7B, a diagram 700b shows a second configuration or approach for a light field display that supports light capture as well. The light field display and camera 310a in this configuration is substantially similar to the light field display 310 shown in FIG. 7A, however, in the light field display and camera 310a there is a camera lens 725 to steer or direct the ray elements 107 to the appropriate light detecting elements (e.g., sensors 127) in an array 710a having groups of light emitting elements 125 along with the light detecting elements.

Figure 8A:
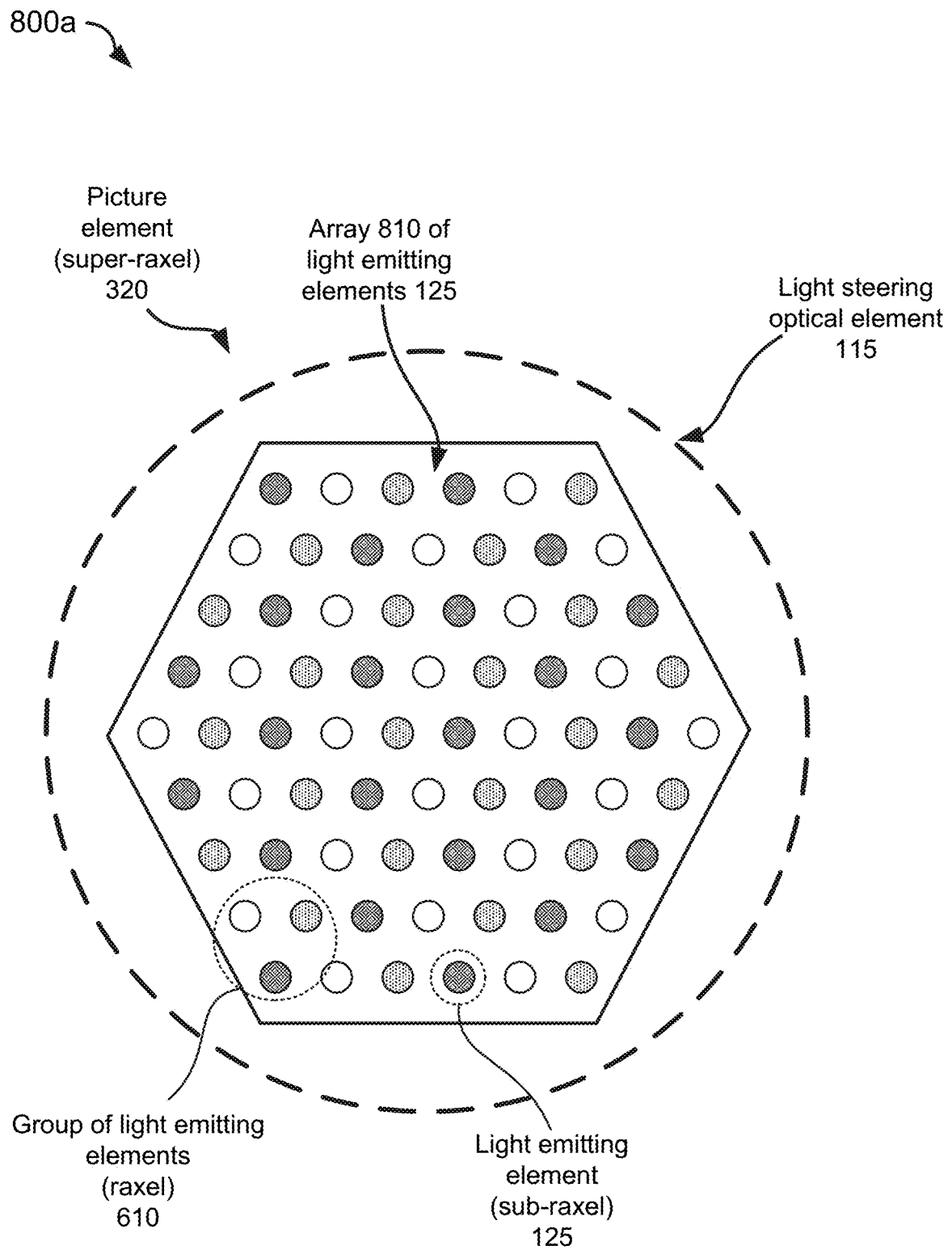
FIG. 8A illustrates an example of an array of light emitting elements in a picture element, in accordance with aspects of this disclosure.

FIG. 8A shows a diagram 800a describing various details of one implementation of a picture element 320. For example, the picture element 320 (e.g., a super-raxel) has a respective light steering optical element 115 (shown with a dashed line) and includes an array or grid 810 of light emitting elements 125 (e.g., sub-raxels) monolithically integrated on a same semiconductor substrate. The light steering optical element 115 can be of the same or similar size as the array 810, or could be slightly larger than the array 810 as illustrated. It is to be understood that some of the sizes illustrated in the figures of this disclosure have been exaggerated for purposes of illustration and need not be considered to be an exact representation of actual or relative sizes.

The light emitting elements 125 in the array 810 include different types of light emitting elements to produce light of different colors and are arranged or configured (e.g., via hardware and/or software) into separate groups 610 (e.g., separate raxels), each of which produces a different light output (e.g., directional light output) that contributes to one or more light field views perceived by a viewer. That is, each group 610 is configured to contribute to one or more of the views that are to be provided to a viewer (or viewers) by the light field display that includes the picture element 320.

As shown in FIG. 8A, the array 810 has a geometric arrangement to allow adjacent or close placement of two or more picture elements. The geometric arrangement can be one of a hexagonal shape (as shown in FIG. 8A), a square shape, or a rectangular shape.

Although not shown, the picture element 320 in FIG. 8A can have corresponding electronic means (e.g., in the backplane 130 in FIG. 1A) that includes multiple driver circuits configured to drive the light emitting elements 125 in the picture element 230. In the example in FIG. 8A, the electronic means can include multiple unit cells configured to control the operation of individual groups and/or light emitting elements that are part of a group.

Figure 8B:
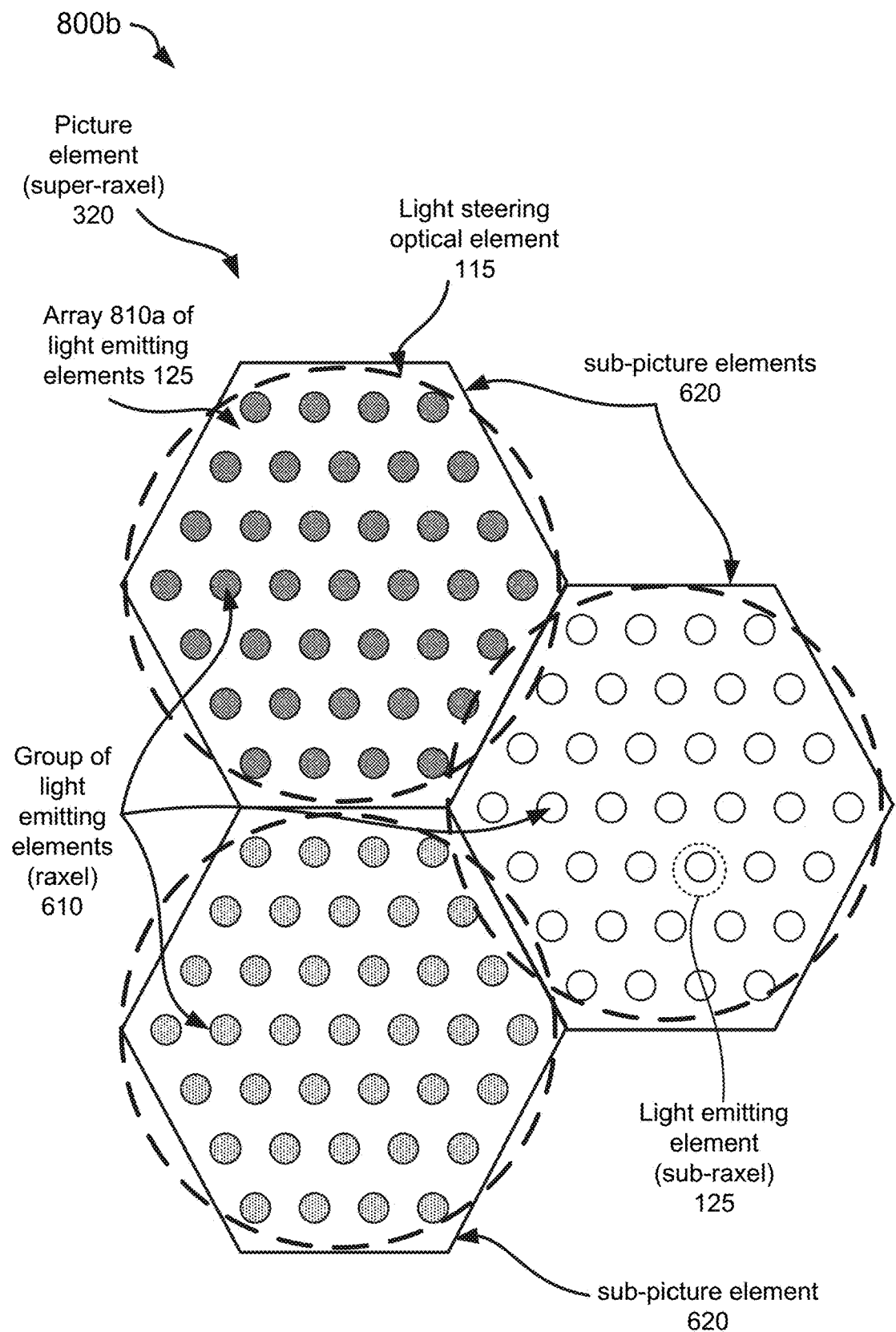
FIG. 8B illustrates an example of a picture element with sub-picture elements, in accordance with aspects of this disclosure.

FIG. 8B shows a diagram 800b describing various details of another implementation of a picture element 320. For example, the picture element 320 (e.g., a super-raxel) in FIG. 8B includes multiple sub-picture elements 620 monolithically integrated on a same semiconductor substrate. Each sub-picture element 620 has a respective light steering optical element 115 (shown with a dashed line) and includes an array or grid 810a of light emitting elements 125 (e.g., sub-raxels) that produce the same color of light. The light steering optical element 115 can be of the same or similar size as the array 810a, or could be slightly larger than the array 810a as illustrated. For the picture element 320, the light steering optical element 115 of one of the sub-picture elements 620 is configured to minimize the chromatic aberration for a color of light produced by the light emitting elements 125 in that sub-picture element 620 by optimizing the structure of the light steering optical element for the specified color wavelength. By minimizing the chromatic aberration it may be possible to improve the sharpness of the light field views and compensate for how the magnification is different away from the center of a picture element. Moreover, the light steering optical element 115 is aligned and bonded to the array 810a of the respective sub-picture element 620.

The light emitting elements 125 of the sub-picture elements 620 are arranged or configured into separate groups 610 (e.g., raxels). Each group 610 can provide a contribution (e.g., a ray element) to a view perceived by a viewer at a certain position or location from the light field display. In one example, each group 610 can include collocated light emitting elements 125 from each of the sub-picture elements 620 (e.g., same position in each sub-picture element). In another example, each group 610 can include non-collocated light emitting elements 125 from each of the sub-picture elements 620 (e.g., different positions in each sub-picture element). In yet another example, each group 610 can include a combination of collocated and non-collocated light emitting elements 125 from each of the sub-picture elements 620.

As shown in FIG. 8B, the array 810a has a geometric arrangement to allow adjacent placement of two or more sub-picture elements. The geometric arrangement can be one of a hexagonal shape (as shown in FIG. 8B), a square shape, or a rectangular shape.

Although not shown, the picture element 320 in FIG. 8B can have corresponding electronic means (e.g., in the backplane 130 in FIG. 1A) that includes multiple driver circuits configured to drive the light emitting elements 125 in the picture element 230. In some examples, one or more common driver circuits can be used for each of the sub-picture elements 620. In the example in FIG. 8B, the electronic means can include multiple unit cells configured to control the operation of individual sub-picture elements and/or light emitting elements that are part of a sub-picture element.

Figure 9A:
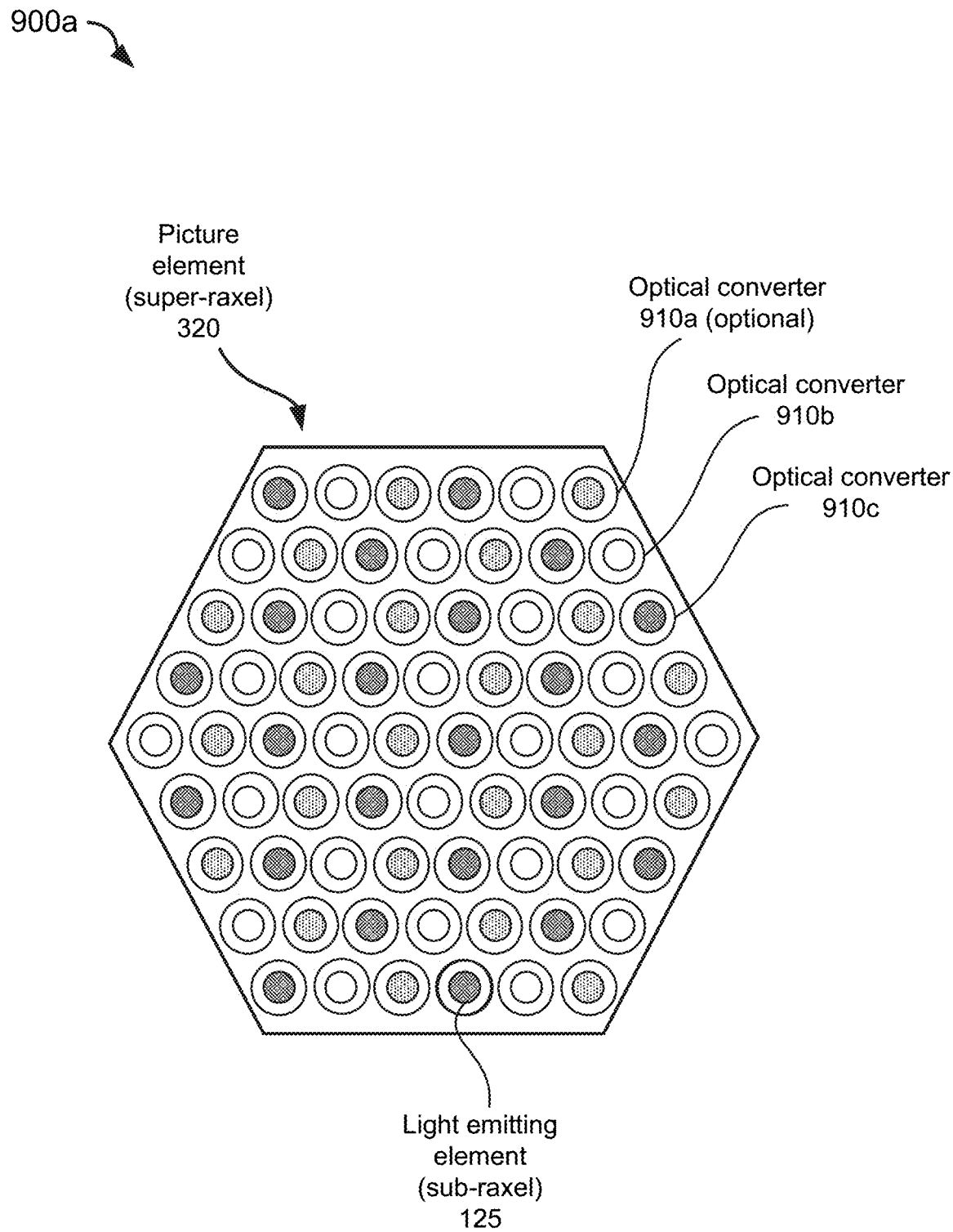
FIG. 9A illustrates an example of a picture element with color converters, in accordance with aspects of this disclosure.

A diagram 900a in FIG. 9A shows an example of the picture element 320 in FIG. 8A where the light emitting elements 125 produce lights of different colors by means of respective, individual optical converters or color conversion media for each of the light emitting elements 125.

In one example, there can be a first converter means (e.g., optical converters 910a) to convert light produced by a first set of the light emitting elements 125 to blue light, a second converter means (e.g., optical converters 910b) to convert light produced by a second set of the light emitting elements 125 to green light, and a third converter means (e.g., optical converters 910c) to convert light produced by a third set of the light emitting elements 125 to red light.

In another example, the first set of the light emitting elements 125 can produce blue light and therefore the first converter means (e.g., optical converters 910a) is not needed (e.g., the first converter means is optional).

Figure 9B:
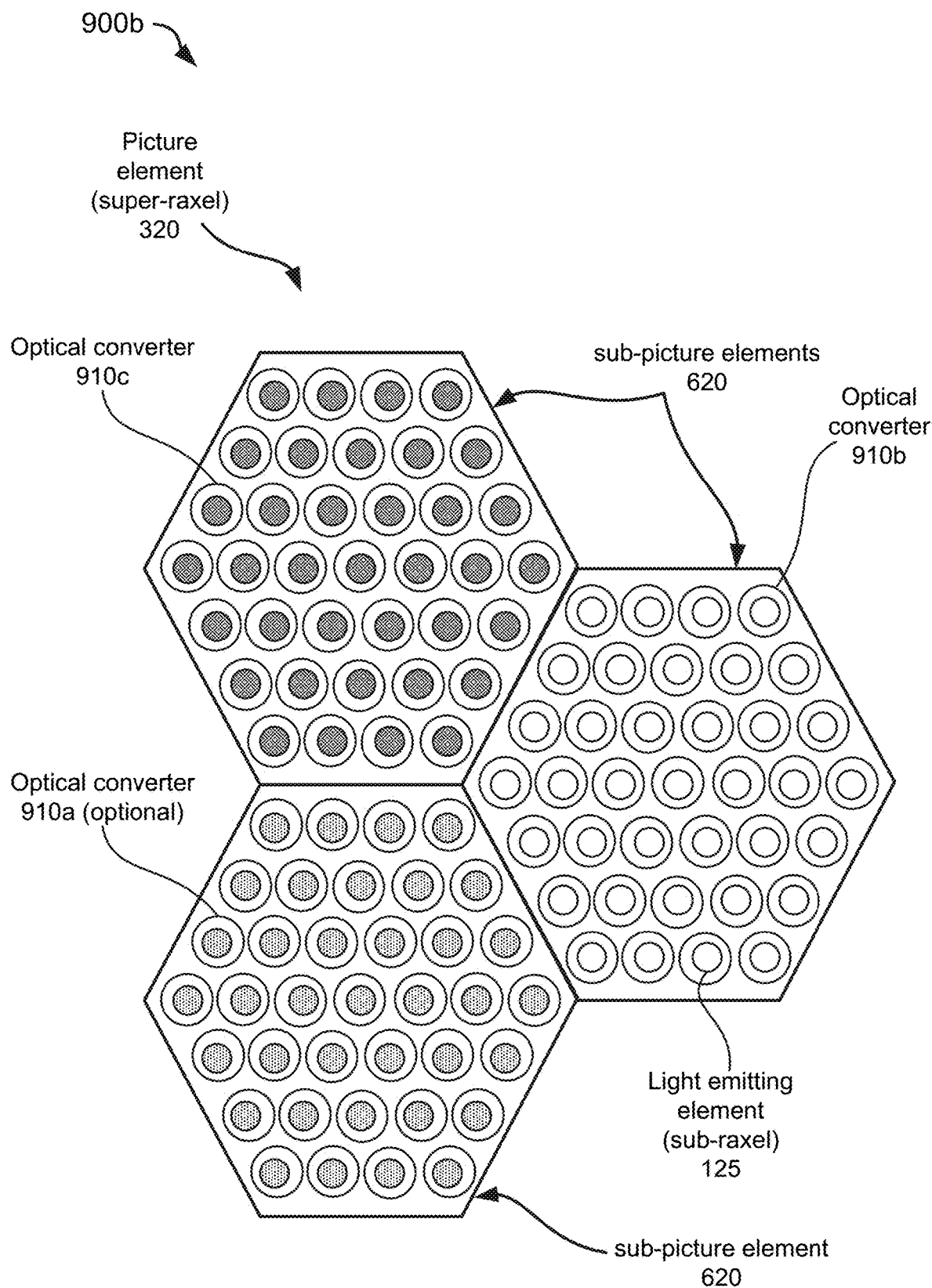
FIG. 9B illustrates an example of sub-picture elements with color converters, in accordance with aspects of this disclosure.

A diagram 900b in FIG. 9B shows an example of the picture element 320 in FIG. 8B where the light emitting elements 125 in each of the sub-picture elements 620 produce light of the same color by means of respective, individual optical converters or color conversion media for each of the light emitting elements 125.

In one example, there can be a first converter means (e.g., optical converters 910a) to convert light produced by the light emitting elements 125 of a first one of the sub-picture elements 620 to blue light, a second converter means (e.g., optical converters 910b) to convert light produced by the light emitting elements 125 of a second one of the sub-picture elements 620 to green light, and a third converter means (e.g., optical converters 910c) to convert light produced by the light emitting elements 125 of a third one of the sub-picture elements 620 to red light.

In another example, the light emitting elements 125 of the first one of the sub-picture elements 620 can produce blue light and therefore the first converter means (e.g., optical converters 910a) is not needed (e.g., the first converter means is optional).

Figure 9C:
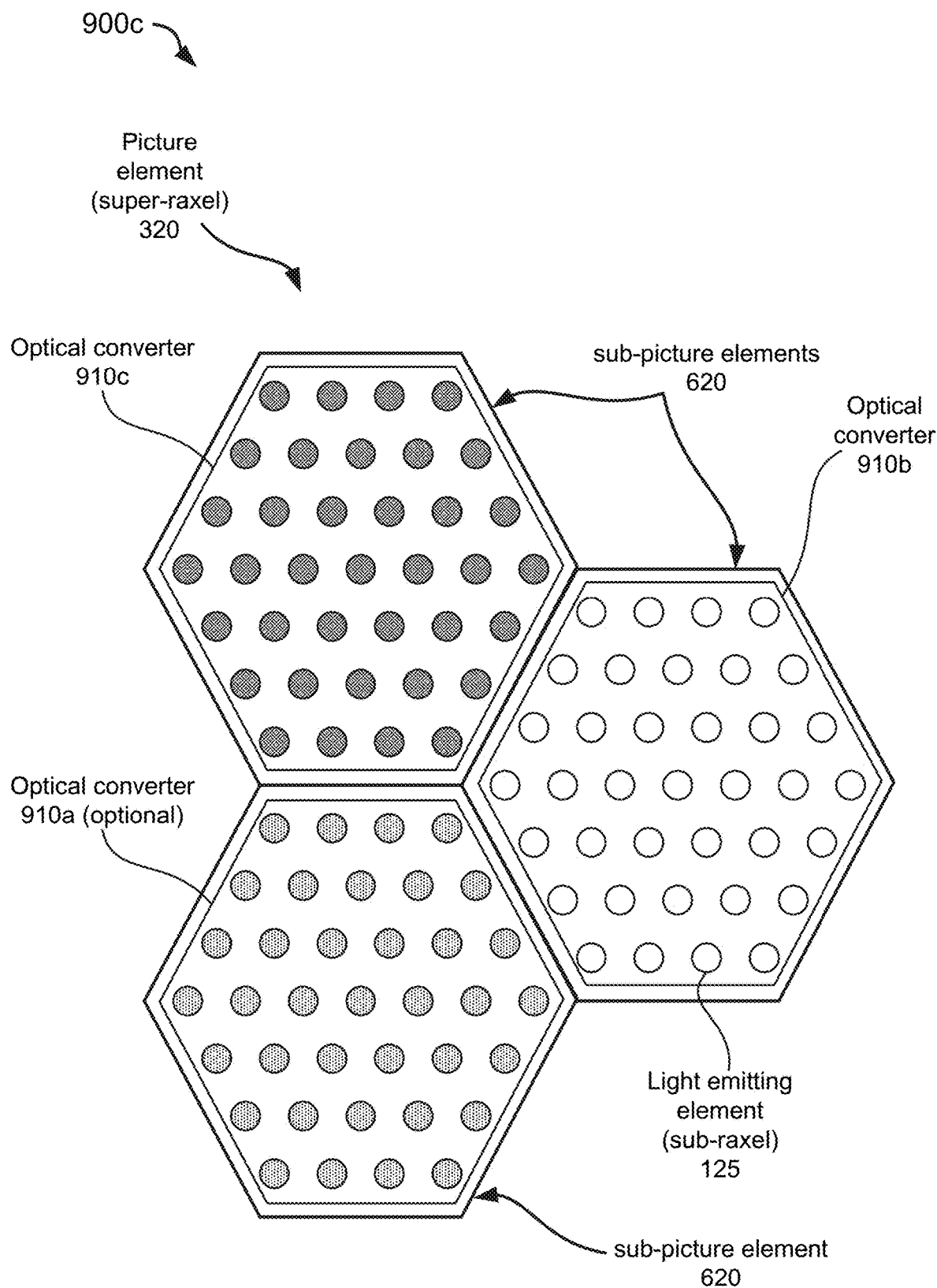
FIG. 9C illustrates another example of sub-picture elements with color converters, in accordance with aspects of this disclosure.

A diagram 900b in FIG. 9C shows another example of the picture element 320 in FIG. 8B where the light emitting elements 125 in each of the sub-picture elements 620 produce light of the same color by means of a respective, single optical converter or color conversion media for each of the sub-picture elements 620.

In one example, there can be a single, first converter means (e.g., optical converter 910a) to convert light produced by all of the light emitting elements 125 of a first one of the sub-picture elements 620 to blue light, a single, second converter means (e.g., optical converter 910b) to convert light produced by all the light emitting elements 125 of a second one of the sub-picture elements 620 to green light, and a single, third converter means (e.g., optical converter 910c) to convert light produced by all of the light emitting elements 125 of a third one of the sub-picture elements 620 to red light.

In another example, the light emitting elements 125 of the first one of the sub-picture elements 620 can produce blue light and therefore the single, first converter means (e.g., optical converters 910a) is not needed (e.g., the first converter means is optional).

For the FIGS. 9A-9C, each of the first converter means, the second converter means, and the third converter means can include a composition having phosphorous to produce the color conversion. For example, different compositions of phosphorous can be used to produce the various color conversions. Alternatively or additionally, each of the first converter means, the second converter means, and the third converter means includes quantum dots. The quantum dots for the first converter means can have a first size, the quantum dots for the second converter means can have a second size, and the quantum dots for the third converter means can have a third size, where the size of the quantum dots affects or controls the wavelength of the light to produce the color conversion.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A display system, comprising:
   a plurality of picture elements supported on a single semiconductor substrate; and
   a backplane including electronic circuitry supported thereon, the electronic circuitry being electronically connected with the plurality of picture elements,
   wherein each one of the plurality of picture elements includes a light steering optical element and an array of light emitting elements,
   wherein the array of light emitting elements includes:
      (i) a first set of inorganic light emitting diodes (LEDs), each inorganic LED in the first set of inorganic LEDs being configured for emitting light at a first wavelength,
      (ii) a second set of inorganic LEDs, each inorganic LED in the second set of inorganic LEDs being configured for emitting light at a second wavelength, and
      (iii) a third set of inorganic LEDs, each inorganic LED in the third set of inorganic LEDs being configured for emitting light at a third wavelength,
   wherein the first, second, and third sets of inorganic LEDs are monolithically integrated on the single semiconductor substrate,
   wherein the light steering optical element is configured for steering the light from each of the first, second, and third inorganic LEDs at a different predetermined refraction angle,
   wherein the light steering optical element is configured for steering the light from each of the first, second, and third inorganic LEDs in a same predetermined spatial direction based on the different predetermined refraction angles, and
   wherein the electronic circuitry is configured for individually driving each light emitting element of the array of light emitting elements.

2. The display system of claim 1, wherein the single semiconductor substrate and the backplane are distinct components.

3. The display system of claim 1, wherein the single semiconductor substrate also serves as the backplane such that the plurality of picture elements and the electronic circuitry are supported on the single semiconductor substrate.

4. The display system of claim 1,
   wherein the first set of inorganic LEDs is formed at least in part of indium-galliumnitride (InGaN) with a first composition of indium (In),
   wherein the second set of inorganic LEDs is formed at least in part of InGaN with a second composition of In, the second composition of In being different from the first composition of In, and
   wherein the third set of LEDs is formed at least in part of InGaN with a third composition of In, the third composition of In being different from the first and second compositions of In.

5. The display of claim 1, wherein each one of the inorganic LEDs in the array of light emitting elements is less than 100 microns in size.

6. The display of claim 1, wherein each one of the inorganic LEDs in the array of light emitting elements is less than 10 microns in size.

7. The display of claim 1, wherein each one of the inorganic LEDs in the array of light emitting elements is less than one micron in size.

8. The display system of claim 1, wherein the first wavelength is in a wavelength range of red light, the second wavelength is in a wavelength range of green light, and the third wavelength is in a wavelength range of blue light.

9. A method for forming a display system, the method comprising:
   integrally forming a plurality of picture elements on a semiconductor substrate;
   electronically connecting a plurality of electronic circuits, formed on a backplane, with the plurality of picture elements,
   wherein integrally forming the plurality of picture elements includes forming, on the semiconductor substrate:
      a first set of inorganic light emitting diodes (LEDs) configured for emitting light at a first wavelength,
      a second set of inorganic LEDs configured for emitting light at a second wavelength, the second wavelength differing from the first wavelength, and
      a third set of inorganic LEDs configured for emitting light at a third wavelength, the third wavelength differing from the first and second wavelengths, and
      wherein a plurality of LED groups each include an inorganic LED from each of the first set, the second set, and the third set of inorganic LEDs;
   aligning an optical steering element with the LED group for steering light emitted by each of the first, second, and third LEDs at a different refraction angle, and
   wherein electronically connecting the plurality of electronic circuits includes configuring the plurality of electronic circuits to individually drive each one of the LEDs in the first, second, and third sets of inorganic LEDs.

10. The method of claim 9, said forming resulting in the semiconductor substrate including a LED group of the plurality of LED groups that includes a first LED of the first set, a second LED of the second set that is most proximate to the first LED, and a third LED of the third set that is most proximate to at least one of the first LED and the second LED, and further comprising:
    aligning the optical steering element with the LED group for steering light emitted by each of the first, second, and third LEDs in a same direction based on the different refraction angles.

* * * * *

UNITED STATES PATENT AND TRADEMARK OFFICE
CERTIFICATE OF CORRECTION

| | | |
|---|---|---|
| PATENT NO. | : 11,694,605 B2 | Page 1 of 1 |
| APPLICATION NO. | : 17/408744 | |
| DATED | : July 4, 2023 | |
| INVENTOR(S) | : He et al. | |

It is certified that error appears in the above-identified patent and that said Letters Patent is hereby corrected as shown below:

In the Claims

In Column 16, Claim 5, Line 5, after "display", insert --system--.

In Column 16, Claim 6, Line 8, after "display", insert --system--.

In Column 16, Claim 7, Line 11, after "display", insert --system--.

Signed and Sealed this
Seventh Day of January, 2025

Derrick Brent
*Acting Director of the United States Patent and Trademark Office*